(12) United States Patent
Zheng et al.

(10) Patent No.: US 9,171,634 B2
(45) Date of Patent: Oct. 27, 2015

(54) MEMORY DEVICE AND METHOD OF CONTROLLING LEAKAGE CURRENT WITHIN SUCH A MEMORY DEVICE

(71) Applicant: ARM LIMITED, Cambridge (GB)

(72) Inventors: Bo Zheng, Cupertino, CA (US); Gus Yeung, Austin, TX (US); Fakhruddin ali Bohra, Bangalore (IN)

(73) Assignee: ARM Limited, Cambridge (GB)

( * ) Notice: Subject to any disclaimer, the term of this patent is extended or adjusted under 35 U.S.C. 154(b) by 173 days.

(21) Appl. No.: 13/827,815

(22) Filed: Mar. 14, 2013

(65) Prior Publication Data
US 2014/0269091 A1    Sep. 18, 2014

(51) Int. Cl.
| | | |
|---|---|---|
| G11C 16/28 | (2006.01) | |
| G11C 7/12 | (2006.01) | |
| G11C 8/08 | (2006.01) | |
| G11C 11/418 | (2006.01) | |
| G11C 11/419 | (2006.01) | |

(52) U.S. Cl.
CPC ........ *G11C 16/28* (2013.01); *G11C 7/12* (2013.01); *G11C 8/08* (2013.01); *G11C 11/418* (2013.01); *G11C 11/419* (2013.01)

(58) Field of Classification Search
CPC ............ G11C 7/12; G11C 16/00; G11C 8/08; G11C 16/28
USPC ............ 365/158.21, 185.2, 194, 191, 230.06, 365/185.11, 189.15
See application file for complete search history.

(56) References Cited

U.S. PATENT DOCUMENTS

| 7,009,880 | B1 * | 3/2006 | Liu ......................... 365/185.11 |
| 8,514,611 | B2 * | 8/2013 | Nguyen et al. ................ 365/154 |
| 2005/0018474 | A1 * | 1/2005 | Sohn ............................ 365/154 |

(Continued)

FOREIGN PATENT DOCUMENTS

| CN | 102467961 | 5/2012 |
| EP | 2 416 322 | 2/2012 |
| WO | 2007/048232 | 5/2007 |

OTHER PUBLICATIONS

A. Raychowdhury et al., "PVT-and-Aging Adaptive Wordline Boosting for 8T SRAM Power Reduction", IEEE International Solid State Circuits Conference, ISSCC 2010 Session 19, High-Performance Embedded Memory, 19.6, 3 pages.

(Continued)

*Primary Examiner* — Hoai V Ho
*Assistant Examiner* — Roberto Mancera
(74) *Attorney, Agent, or Firm* — Pramudji Law Group PLLC; Ari Pramudji

(57) ABSTRACT

A memory device includes an array of memory cells arranged as a plurality of rows and columns, each row being coupled to an associated read word line, and each column forming at least one column group, where the memory cells of each column group are coupled to an associated read bit line. Each column has an active mode of operation where a read operation may be performed on an activated memory cell within that column group, and a non-active mode of operation where the read operation is not performable. Precharge circuitry is used, for each column group, to precharge the associated read bit line to a first voltage level prior to the read operation. Each memory cell includes coupling circuitry connected between the associated read bit line and a reference line associated with the column group containing that memory cell.

17 Claims, 10 Drawing Sheets

(56) References Cited

U.S. PATENT DOCUMENTS

| | | | |
|---|---|---|---|
| 2006/0133161 A1* | 6/2006 | Jacquet et al. | 365/189.09 |
| 2006/0146638 A1* | 7/2006 | Chang et al. | 365/230.05 |
| 2007/0279966 A1* | 12/2007 | Houston | 365/154 |
| 2008/0151653 A1* | 6/2008 | Ishikura et al. | 365/189.15 |
| 2008/0165562 A1* | 7/2008 | Matick et al. | 365/72 |
| 2009/0168496 A1* | 7/2009 | Mikan et al. | 365/154 |
| 2010/0039876 A1 | 2/2010 | Adams et al. | |
| 2010/0254199 A1* | 10/2010 | Houston | 365/189.05 |
| 2011/0158029 A1* | 6/2011 | Sasaki | 365/230.06 |
| 2011/0292743 A1* | 12/2011 | Zimmerman | 365/189.15 |
| 2012/0014173 A1* | 1/2012 | Deng | 365/156 |
| 2012/0140551 A1 | 6/2012 | Arsovski et al. | |
| 2013/0077416 A1* | 3/2013 | Hold | 365/189.15 |
| 2013/0201766 A1* | 8/2013 | Feki | 365/189.02 |
| 2014/0071737 A1* | 3/2014 | Sharma et al. | 365/156 |
| 2014/0071776 A1* | 3/2014 | Chong et al. | 365/194 |

OTHER PUBLICATIONS

Y. Chiu et al., "8T Single-Ended Sub-Threshold SRAM with Cross-Point Data-Aware Write Operation", 2011 IEEE, 978-1-61284-660-6/11, 6 pages.

T. Kim et al., "An 8T Subthreshold SRAM Cell Utilizing Reverse Shirt Channel Effect for Write Margin and Read Performance Improvement", IEEE 2007 Custom Intergrated Circuits Conference (CICC), 2007 IEEE, 14244-1623-X/07, 4 pages.

H. Morimura et al., "A Step-Down Boosted-Wordline Scheme for 1-V battery-Operated Fast SRAM's", IEEE Journal of Solid-State Circuits, vol. 33, No. 8, Aug. 1998, 8 pages.

D.P. Wang et al., "A 45nm Dual-Port SRAM with Write and Read Capacity Enhancement at Low Voltage", 2007 IEEE, 978-1-4244-1593-9-07, 4 pages.

M. Iijima et al., "Low Power SRAM with Boost Driver Generating Pulsed Word Line Voltage for Sub-1V Operation", Journal of Computers, vol. 3, No. 5, May 2008, 7 pages.

GB Search Report dated Aug. 27, 2014 in GB 1403303.9, 4 pages.

* cited by examiner

MEMORY DEVICE AND METHOD OF CONTROLLING LEAKAGE CURRENT WITHIN SUCH A MEMORY DEVICE

BACKGROUND OF THE INVENTION

1. Field of the Invention

The present invention relates to a memory device comprising an array of memory cells, and to a method of controlling leakage current within such a memory device.

2. Description of the Prior Art

When developing memory devices, significant development effort is expended in seeking to improve the performance, and/or reduce the power consumption, associated with write and read operations. For example, the articles "A Step-Down Boosted-Wordline Scheme for 1-V Battery-Operated Fast SRAMs", by H Morimura et al, IEEE Journal of Solid-State Circuits, Volume 33, No. 8, August 1998, Pages 1220 to 1227, "PVT-and-Aging Adaptive Wordline Boosting for 8T SRAM Power Reduction" by A Raychowdhury et al, ISSCC 2010, Session 19, High-Performance Embedded Memory, 19.6, Pages 352 to 354, and "Low Power SRAM with Boost Driver Generating Pulsed Word Line Voltage for Sub-1V Operation" by M Iijima et al, Journal of Computers, Volume 3, No. 5, May 2008, Pages 34 to 40, describe various techniques for boosting a word line voltage for either performance or power reduction reasons.

The article "A 45 nm Dual-Port SRAM with Write and Read Capability Enhancement at Low Voltage" by D Wang et al, IEEE 2007, Pages 211 to 214 describes write and read enhancement mechanisms which boost the ground line to a negative potential. As another approach for improving performance, the article "An 8T Sub-Threshold SRAM Cell Utilising Reverse Short Channel Effect for Write Margin and Read Performance Improvement" by T Hyoung Kim et al, IEEE 2007 Custom Integrated Circuits Conference (CICC), Pages 241 to 244, describes improving write margin and read performance of 8T sub-threshold SRAMs by using long channel devices to utilise the pronounced reverse short channel effect. The article "8T Single-Ended Sub-Threshold SRAM with Cross-Point Data-Aware Write Operation" by Yi Chiu et al, IEEE 2011, pages 169 to 174, describes a 8T SRAM cell suitable for low power and low voltage operation, the cell having a structure which maintains disturbance free read operation, whilst improving the write-ability of the cell in order to improve the minimum voltage at which write operations can be performed.

Whilst articles such as those mentioned above are concerned with improving performance and/or reducing power consumption of the memory device, another issue is becoming more and more significant, this issue being the amount of leakage current observed within the memory device.

As process geometries shrink in modern data processing systems, the variability in the operating characteristics of the individual circuit elements increases. Considering as an example a memory device consisting of an array of memory cells, it will be understood that each memory cell will typically consist of a number of electronic components such as transistors, and the variability in those individual components significantly increases as process geometries shrink. Furthermore, there is an increasing desire to operate data processing systems at lower and lower supply voltages, but as the supply voltage decreases, reliability issues due to the variations in the individual components become more prominent.

One reliability concern arises from the fact that leakage current can increase within the individual memory cells as the process geometries shrink. There are various potential leakage current paths within a memory device, but one area of concern is leakage current arising through components connected to a bit line within the memory device.

An array of memory cells will typically be arranged as a plurality of rows and columns, each row of memory cells being coupled to at least one associated word line (in some implementations there will be separate word lines for write operations and read operations), and each column of memory cells forming at least one column group. One or more bit lines will typically be associated with each column group (again some implementations will provide separate write bit lines and read bit lines), and each memory cell in the column group will have components coupled to such bit lines.

When the memory cells in one or more columns are not being accessed, there will continue to be various components coupled to the bit lines, and these can give rise to leakage paths through which leakage current occurs, increasing the power consumption of the device.

Considering as an example a single-ended memory cell, such a memory cell uses a single read bit line coupled via coupling circuitry to an internal node of the memory cell to allow the data value stored in that memory cell to be read during a read operation. The single read bit line is precharged to a first voltage level (typically the supply voltage Vdd) prior to a read operation, and then if a memory cell coupled to that read bit line is addressed during a read operation (by an asserted read word line signal on the read word line to which that memory cell is coupled), the voltage on the bit line will either stay at the first voltage level, or will discharge towards a second voltage level (typically a ground potential), depending on the value stored within the memory cell.

When the memory cells of a column group are not being subjected to a read operation, all of the memory cells within a column group will still be coupled to the read bit line via their associated coupling circuitry, and this can give rise to significant leakage current.

Accordingly, it would be desirable to provide an improved technique for reducing such leakage current within a memory device, without compromising performance of the memory device.

SUMMARY OF THE INVENTION

Viewed from a first aspect, the present invention provides a memory device comprising: an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation is able to be performed on an activated memory cell within that column group, and a non-active mode of operation where said read operation is not able to be performed; precharge circuitry configured, for each column group, to precharge the associated read bit line to a first voltage level prior to said read operation; each memory cell comprising coupling circuitry connected between the associated read bit line and a reference line associated with the column group containing that memory cell; reference line control circuitry configured, for each reference line having an associated column group in said active mode of operation, to connect that reference line to a second voltage level different to said first voltage level, and configured for each reference line not having an associated column group in said active mode of operation to disconnect that reference line from said second voltage level; and word line boosting circuitry configured to generate an asserted word line signal at a boosted voltage level on the read word line associated with the row of memory cells to be activated during said read operation; during said read operation the coupling circuitry associated with each activated memory cell is configured to be activated by the asserted word line signal and to selectively discharge the associated read bit line towards the second voltage level present on said associated reference line dependent on a data value stored within that activated memory cell; and for each reference line not having an associated column group in said active mode of operation, the action of the reference line control circuitry disconnecting that reference line from the second voltage level serving to remove a leakage current path through the coupling circuitry of each memory cell of that associated column group.

In accordance with the present invention, reference lines are established, and each column group is associated with one of those reference lines. For each reference line, reference line control circuitry is then used to selectively connect that reference line to the second voltage level, or to disconnect the reference line from the second voltage level. In particular, for each reference line that has an associated column group that is in an active mode of operation (i.e. where a read operation can be performed on an activated memory cell within that column group) the reference line control circuitry connects that reference line to the second voltage level. Conversely, for any reference line that does not have an associated column group in the active mode of operation, that reference line is disconnected from the second voltage level, causing the voltage on that reference line to float, thereby reducing a leakage current path though the coupling circuitry of each memory cell of that associated column group.

Such an approach significantly reduces the leakage current through the coupling circuitry. However, since the reference line control circuitry will result in an additional component being present in the path between the read bit line and the second voltage level when the associated column group is in the active mode of operation, this could potentially impact the performance of the read operation. To compensate for that potential reduction, the present invention includes word line boosting circuitry configured to generate an asserted word line signal at a boosted voltage level on the read word line, this increasing the performance of the coupling circuitry and ensuring that the presence of the reference line control circuitry does not impact on the read performance. Boosting the read word line voltage can increase read performance significantly, thus allowing the above arrangement to simultaneously achieve both low leakage and high performance.

The reference lines can be established in a variety of ways. For example, in one embodiment each column group is configured to have its own reference line. In an alternative embodiment, multiple of the column groups may share a reference line. There are a number of ways in which multiple column groups can be configured to share a reference line. For example, the multiple column groups that share a reference line may reside within a single column of the memory array. Alternatively, in embodiments where the various columns of the array are multiplexed to allow different parts of the memory to be accessed during a read operation, the multiple columns that share a reference line may be multiple columns that are provided in a multiplexed arrangement such that only one of those multiple columns is activated during a particular read operation.

The reference line control circuitry can take a variety of forms. However, in one embodiment the reference line control circuitry comprises a reference line control unit for each reference line, and the memory device comprises control circuitry configured to generate an enable signal for each reference line control unit. Each reference line control unit is responsive to the control circuitry setting the enable signal to connect the associated reference line to the second voltage level, and is responsive to the control circuitry clearing the enable signal to disconnect the associated reference line from the second voltage level.

Each reference line control unit can take a variety of forms. In one embodiment, each reference line control unit comprises NMOS transistor circuitry, and the enable signal is set to a logic one value to turn on the NMOS transistor circuitry, and is cleared to a logic zero value to turn off the NMOS transistor circuitry.

The NMOS transistor circuitry can be arranged in a variety of ways. For example, to increase the drive strength, it can be constructed from a plurality of NMOS transistors in parallel between the reference line and the second voltage level. This would ensure that in situations where the associated reference line had an associated column group in the active mode of operation, the NMOS transistor circuitry would operate more strongly to pull the reference line to the second voltage level. However, it would increase the leakage current through the NMOS transistor circuitry in the non-active mode of operation when compared with a weaker NMOS transistor circuitry. In an alternative embodiment, the NMOS transistor circuitry forming the reference line control circuitry may be arranged as a stack of NMOS transistors placed in series between the reference line and the second voltage level. This would decrease the drive strength during the active mode of operation, but would ensure that when the associated reference line did not have an associated column group in the active mode of operation, the stacked arrangement of NMOS transistors forming the reference line control circuitry would improve the leakage current reduction obtainable.

The enable signal generated for each reference line control unit can be generated in a variety of ways. However, in embodiments where the earlier described multiplexing arrangement is used, the enable signal may be derived from a column multiplexer read selection signal used to identify the columns of the array whose memory cells are to be subjected to the read operation.

In one embodiment, the memory device further comprises word line driver circuitry configured, during the read operation, to generate the asserted word line signal as a pulse signal on the read word line coupled to the row of memory cells to be activated during said read operation so as to activate those memory cells whilst the pulse signal is asserted, the word line boosting circuitry being incorporated within the word line driver circuitry. Further, sense amplifier circuitry is connected to the associated read bit line of each column group, and is configured for each activated memory cell to determine that that activated memory cell stores a first value if the voltage on the associated read bit line transitions to a trip voltage level between said first and said second voltage levels whilst the read word line pulse signal is asserted, and to determine that that activated memory cell stores a second value if the voltage on the associated read bit line does not transition to said trip voltage level whilst the read word line pulse signal is asserted.

In such an embodiment, the word line boosting circuitry can be arranged in a variety of ways. However, in one embodiment, the word line driver circuitry includes an inverter circuit whose output forms the read word line pulse signal, and the word line boosting circuitry is configured to boost the voltage across the inverter circuit for at least part of the period that the read word line pulse signal is asserted. This provides a simple and effective mechanism for boosting the voltage level of the asserted word line signal to thereby improve the speed of operation of the coupling circuitry.

In one embodiment, the memory device may further comprise bit line keeper circuitry coupled to each read bit line and configured during a read operation to weakly pull the voltage on each read bit line towards the first voltage level so as to avoid leakage current within the coupling circuitry of the memory cells of the associated memory cell group from causing the voltage on the associated read bit line to transition to said trip voltage level between said first and said second voltage levels whilst the read word line pulse signal is asserted. The bit line keeper circuitry hence ensures that the correct data value is detected by the read operation, by preventing leakage current within the coupling circuitry from potentially causing an incorrect value to be sensed.

The coupling circuitry associated with each memory cell can take a variety of forms. However, in one embodiment the coupling circuitry of each memory cell comprises a plurality of coupling transistors arranged in series between the associated read bit line and the reference line, a gate terminal of at least one of the coupling transistors being connected to the associated read word line and a gate terminal of at least one other of the coupling transistors being connected to an internal storage node of the memory cell. In one particular embodiment, the coupling transistors are NMOS transistors.

The first and second voltage levels will vary dependent on implementation. However, in one embodiment the first voltage level is a supply voltage level and the second voltage level is a ground voltage level.

Whilst in one embodiment each column of memory cells may include a single column group, in an alternative embodiment each column of memory cells forms a plurality of column groups.

Viewed from a second aspect, the present invention provides a method of controlling leakage current within a memory device comprising an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation is able to be performed on an activated memory cell within that column group, and a non-active mode of operation where said read operation is not able to be performed, the method comprising: for each column group, precharging the associated read bit line to a first voltage level prior to said read operation; for each memory cell, providing coupling circuitry connected between the associated read bit line and a reference line associated with the column group containing that memory cell; for each reference line having an associated column group in said active mode of operation, connecting that reference line to a second voltage level different to said first voltage level; generating an asserted word line signal at a boosted voltage level on the read word line associated with the row of memory cells to be activated during said read operation; during said read operation, causing the coupling circuitry associated with each activated memory cell to be activated by the asserted word line signal and to selectively discharge the associated read bit line towards the second voltage level present on said associated reference line dependent on a data value stored within that activated memory cell; and for each reference line not having an associated column group in said active mode of operation, disconnecting that reference line from said second voltage level in order to remove a leakage current path through the coupling circuitry of each memory cell of that associated column group.

Viewed from a third aspect, the present invention provides a memory device comprising: an array of memory cell means arranged as a plurality of rows and columns, each row of memory cell means for coupling to an associated read word line, each column of memory cell means for forming at least one column group, and the memory cell means of each column group for coupling to an associated read bit line, each column group having an active mode of operation where a read operation is able to be performed on an activated memory cell means within that column group, and a non-active mode of operation where said read operation is not able to be performed; precharge means, for each column group, for precharging the associated read bit line to a first voltage level prior to said read operation; each memory cell means comprising coupling means for connecting between the associated read bit line and a reference line associated with the column group containing that memory cell means; reference line control means, for each reference line having an associated column group in said active mode of operation, for connecting that reference line to a second voltage level different to said first voltage level, and for each reference line not having an associated column group in said active mode of operation, for disconnecting that reference line from said second voltage level; and word line boosting means for generating an asserted word line signal at a boosted voltage level on the read word line associated with the row of memory cell means to be activated during said read operation; during said read operation the coupling means associated with each activated memory cell means being activated by the asserted word line signal and for selectively discharging the associated read bit line towards the second voltage level present on said associated reference line dependent on a data value stored within that activated memory cell means; and for each reference line not having an associated column group in said active mode of operation, the action of the reference line control means disconnecting that reference line from the second voltage level serving to remove a leakage current path through the coupling means of each memory cell of that associated column group.

Viewed from a fourth aspect, the present invention provides a computer program storage medium (for example a non-transitory storage medium) storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device in accordance with the first aspect of the present invention.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1A:
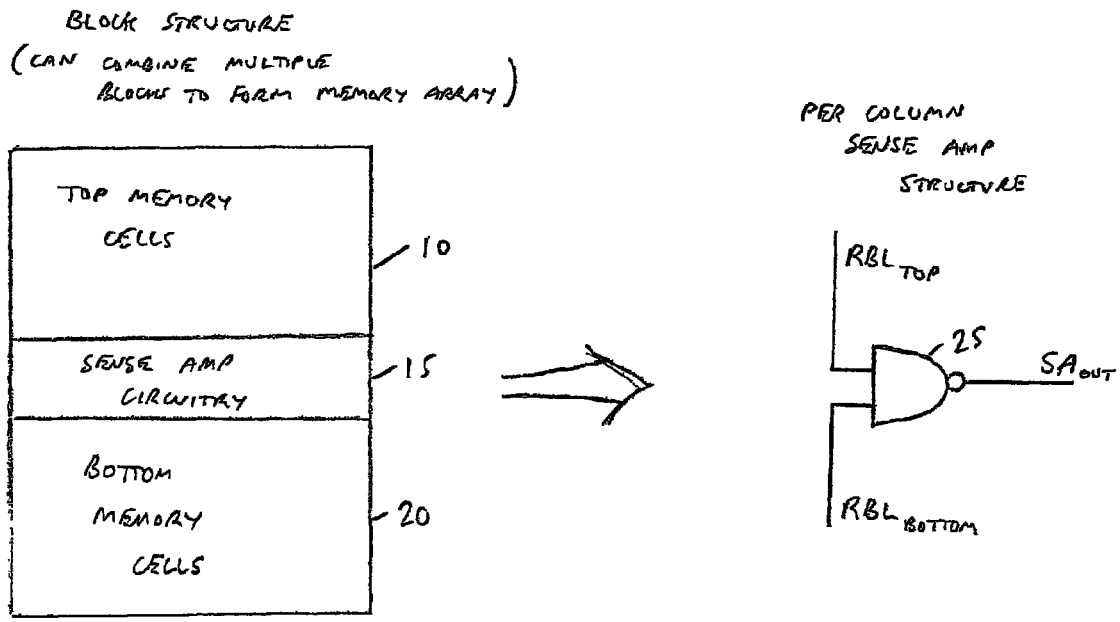
FIGS. 1A and 1B illustrate two alternative configurations of memory block structures that can be used to form a memory array of a memory device in accordance with embodiments.
Figure 1B:
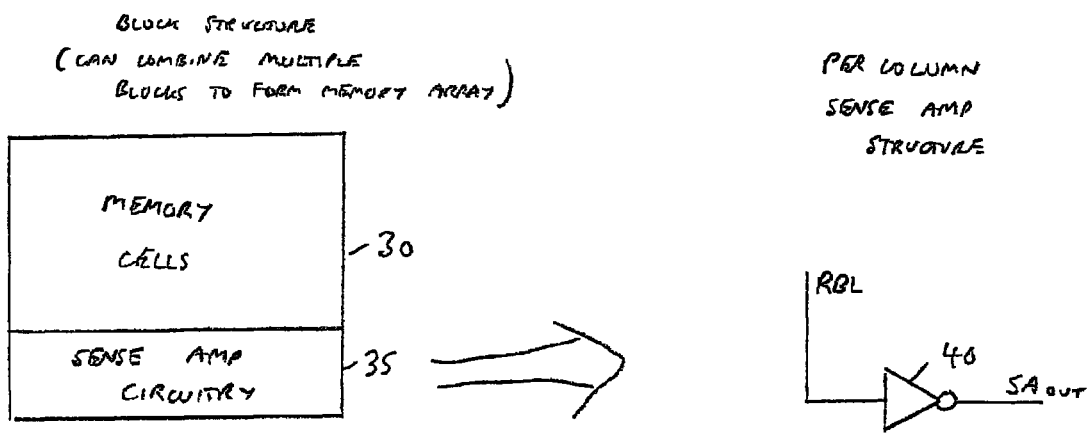

A memory device in accordance with one embodiment comprises an array of memory cells arranged as a plurality of rows and columns, each row of memory cells being coupled to an associated read word line, and each column of memory cells forming at least one column group, with the memory cells of each column group being coupled to an associated read bit line. The memory array may be constructed using block structures such as shown in FIGS. 1A and 1B. Whilst in one embodiment the memory array may comprise a single block structure, in an alternative embodiment multiple block structures may be used to form the memory array.

Considering the block structure of FIG. 1A, two memory cell groups are defined, namely a top memory cell group 10 and a bottom memory cell group 20, both of these memory cell groups sharing the same sense amplifier circuitry 15. The top and bottom memory cell groups may provide multiple columns of cells, but each column within a particular memory cell group will form the earlier mentioned column group. Accordingly, in this embodiment each column of memory cells within the top memory cell group 10 will be connected to an associated read bit line, and each column of memory cells within the bottom memory cell group 20 will also be connected to an associated read bit line. The read bit lines connected to columns of the top memory cell group will be referred to as top read bit lines ($RBL_{TOP}$) whilst the read bit lines associated with columns of the bottom memory cell group 20 will be referred to as bottom read bit lines ($RBL_{BOTTOM}$).

In accordance with the design of FIG. 1A, for each top read bit line and corresponding bottom read bit line, the sense amplifier circuitry will provide a NAND gate structure 25 to produce a consolidated sense amplifier output for that pair of read bit lines. Prior to a read operation, both bit lines will be precharged to a logic one value. During the read operation, a read word line pulse signal will be asserted to activate the memory cells within an addressed row of the array, and accordingly considering a particular pair of top and bottom read bit lines, at most only one of the memory cells connected to those pair of bit lines will be activated. During the read operation, that activated memory cell will discharge the voltage on its associated read bit line towards the logic zero voltage level (typically a ground voltage level) if a data value stored in that activated memory cell has a first value. If instead the data value is at a second value, no such discharging will be performed. Due to the operation of the NAND gate structure, it will be appreciated that the sense amp output signal will remain at a logic zero value if neither of the pair of read bit lines is discharged, but will flip to a logic one value if either one of the read bit lines is discharged towards a logic zero level. Hence, when the activated memory cell stores the first value, the sense amplifier output should flip from a logic zero value to a logic one value during the period whilst the read word line pulse signal is asserted, but if the activated memory cell stores the second value the sense amplifier output should not flip, and instead should remain at the logic zero level.

FIG. 1B illustrates an alternative block structure, where each group of memory cells 30 has its own associated sense amplifier circuitry 35. In this example, the sense amplifier circuitry can be constructed using an inverter 40, and again the sense amplifier output observes the same property as described earlier with reference to FIG. 1A. In particular, if an addressed memory cell in a column stores the first value, the bit line should discharge towards a logic zero level, causing the sense amplifier output to flip to a logic one value during the period whilst the read word line pulse signal is asserted. If instead the addressed memory cell stores the second value, no flip in the output of the sense amplifier should occur, and instead it should remain at a logic zero level.

Figure 2:
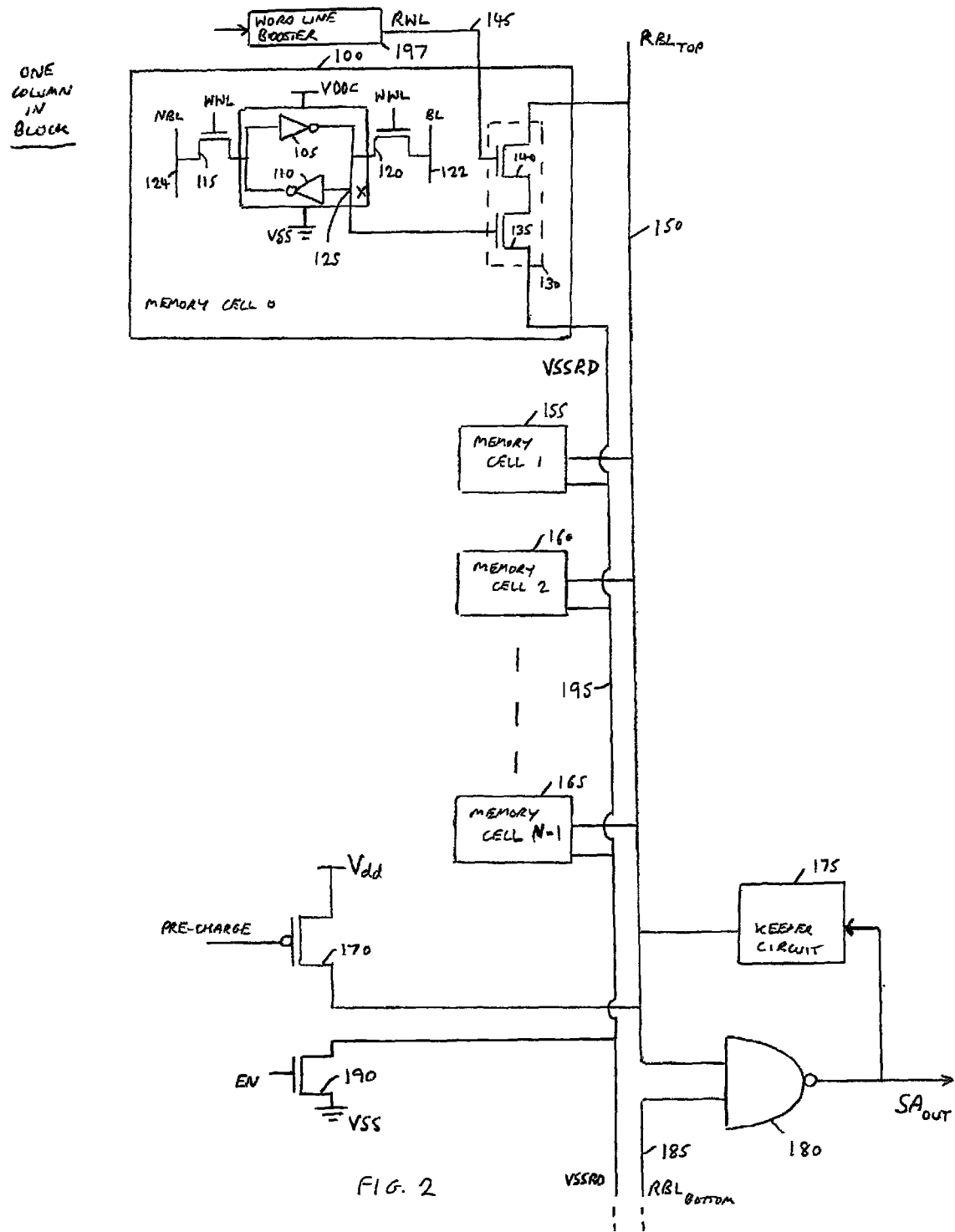
FIG. 2 illustrates components provided in association with one column within a block structure in accordance with the arrangement of FIG. 1A.

FIG. 2 is a diagram illustrating the components provided in association with a single column within the block structure of FIG. 1A in accordance with one embodiment. In particular, the components connected to the top read bit line 150 are illustrated, that read bit line 150 providing one input to the NAND gate 180. The bottom read bit line 185 provides the second input, and will have the same arrangement of components connected to it as are shown in FIG. 2 in respect of the top read bit line 150.

Considering the top read bit line 150, a series of memory cells 100, 155, 160, 165 are connected to the read bit line. Each memory cell has the form shown in detail with respect to the memory cell 100. In particular, the basic memory cell consists of the two NMOS pass gate transistors 115, 120 and the two inverters 105, 110 (formed in the standard way using an arrangement of four transistors), but in addition coupling circuitry 130 consisting of two NMOS transistors 135, 140 is also provided for use during a read operation.

Considering first a write operation directed to the memory cell 100, the write word line (WWL) signal will be asserted to turn on the pass gate transistors 115, 120. Write driver circuitry will then control the voltages on the write bit lines 122, 124 in order to cause the required data value to be written into the memory cell, and at the end of the write operation the write word line signal will be de-asserted to turn off the pass gate transistors 115, 120, and hence isolate the data holding part of the cell formed by the inverters 105, 110 from the write bit lines 122, 124. Accordingly, at this point a logic one or a logic zero value will be stored at the node X 125, dependent on the voltages driven on the bit lines 122, 124 during the write operation.

Whereas in a typical prior art system, the transistor 135 of the coupling circuitry 130 would normally be connected directly to the same ground potential as is used for the inverter pair 105, 110, in accordance with the described embodiments the coupling circuitry 130 is actually connected to its own virtual ground level VSSRD provided by a reference line 195, with that reference line then being coupled via reference line control circuitry 190 to the ground potential.

In the embodiment shown in FIG. 2, the reference line control circuitry takes the form of NMOS transistor circuitry, with the gate of the NMOS transistor circuitry receiving an enable signal which will either be set or cleared. In particular, when the column group connected to the reference line 195 is in an active mode of operation, i.e. where a read operation can be performed on any of the memory cells within that associated column group, the enable signal is set high to turn on the reference line control circuitry 190, and hence connect the reference line 195 to the ground potential. At this point, a read operation can be performed in the standard manner.

In particular, during a read operation, a signal on the read word line 145 will be asserted, turning on the transistor 140 of the coupling circuitry 130 for an addressed row of memory cells. Prior to the read word line signal being asserted, the read bit line 150 will have been precharged to the logic one (Vdd) level using the precharge PMOS transistor 170, and accordingly it can be seen that once the read word line signal is asserted, the read bit line 150 will selectively discharge towards the logic zero level dependent on the value stored at the node X 125 within the memory cell 100. In particular, if the node 125 stores a first value, namely a logic one value, this will turn on the NMOS transistor 135, and cause the bit line 150 to be discharged towards ground via the reference line 195 (which is connected to ground due to the NMOS transistor circuitry 190 being turned on). Conversely, if the node 125 stores a logic zero value, the transistor 135 will not be turned on, and the voltage on the bit line should remain at the Vdd level. The sense amplifier 180 will initially have an output at a logic zero level, but as discussed earlier that output will flip to a logic one level during the course of the read operation if the node 125 stores a logic one value and hence the read bit line 150 is discharged.

However, it will be noted that multiple memory cells are coupled to the read bit line 150, each having associated coupling circuitry 130. As device geometries shrink, it has been found that the leakage current through the coupling circuitry has become more significant. In particular, whilst only one of the coupling circuits within the column will have its transistor 140 turned on by an asserted read word line signal, all of the other coupling circuits may contribute to leakage current. The most significant cause of the leakage current is from non-addressed memory cells that store at their node 125 a logic one value. In this situation, although the coupling transistor 140 is turned off, the coupling transistor 135 is turned on, and leakage current through the coupling circuit 130 in that situation will tend to pull the voltage on the read bit line 150 down towards the logic zero level. Some further leakage current also occurs in non-addressed memory cells where the node X 125 stores a logic zero value, and indeed in connection with an addressed memory cell where node X 125 stores a logic zero value (in which case the transistor 140 will be turned on but the transistor 135 will be turned off).

It has been found that as process geometries shrink and the leakage current increases, these effects can potentially give rise to a situation where even though the addressed memory cell stores a logic zero value at its node 125, and accordingly the bit line 150 should remain at the Vdd supply level during the read operation, the leakage current causes the voltage on the bit line to discharge to a significant extent during the period in which the read word line is asserted that the sense amplifier 180 flips its output state to a logic one value, thereby giving an incorrect read value.

In accordance with the embodiment illustrated in FIG. 2, a keeper circuit 175 is provided to prevent such a situation arising. The keeper circuitry can take a variety of forms. In one embodiment, the keeper circuit takes the form of a PMOS structure whose source and drain are connected between VDD and the read bit line, and whose gate is connected to the output from the sense amplifier. At the end of the precharge phase, both top read bit line 150 and the bottom read bit line 185 will be precharged to a logic one level, meaning that the output of the NAND gate 180 is at a logic zero level, hence turning on the PMOS structure within the keeper circuit, and causing the read bit line to be weakly pulled towards the logic one level. If during a subsequent read operation, the addressed memory cell does not store a data value which causes the read bit line to be discharged, then the above mentioned leakage current in the coupling circuits 130 will be insufficient to overcome the weak pull up function of the keeper circuit 175, and hence will prevent an incorrect sensing of the data value stored within the addressed memory cell.

Other forms of keeper circuit can also be provided if desired. For example, a pulse driven keeper circuit is described in commonly owned, co-pending U.S. patent application Ser. No. 13/612,953, the entire contents of which are hereby incorporated by reference.

However, the coupling circuits not only give rise to leakage current whilst read operations are being performed, but can also give rise to leakage current in situations where a read operation is not being performed, for example because a write operation is instead being performed, or because the particular portion of memory is not being addressed by the read operation.

In accordance with the embodiment shown in FIG. 2, such leakage current is reduced by clearing the enable signal to the reference line control circuitry 190 during such periods of time, thereby disconnecting the reference line 195 from the ground potential, and causing the voltage on the reference line to float. During this period, the voltage on the reference line 195 will increase, and accordingly the leakage current through the coupling circuits 130 will reduce.

Whilst the use of the reference line control circuitry in such a manner significantly reduces the leakage current in such situations, it could potentially reduce the performance of the read operation during the periods where the reference line control circuitry is enabled to connect the reference line 195 to ground, due to the additional NMOS circuitry in the path to ground. However, in accordance with the embodiment of FIG. 2, word line booster circuitry 197 is provided for boosting the voltage of the asserted read word line 145, this turning on the associated NMOS transistor 140 within the coupling circuitry 130 more strongly, and increasing the performance of the coupling circuitry 130. It has been found that this improvement in performance can more than offset any potential reduction that would arise through the introduction of the reference line control circuitry 190, and accordingly it is possible to maintain the performance of read operations, whilst significantly reducing leakage current through the coupling circuits 130 when a read operation is not being performed.

The sizing of the NMOS transistor circuitry 190 used to provide the reference line control circuitry can be varied as desired. The larger the NMOS transistor circuitry 190 is made, the stronger it will pull down the reference line 195 to the ground potential when the enable signal is set. This will improve performance, but will give less leakage savings than would be the case if the NMOS transistor circuitry 190 were made smaller. Conversely, if the NMOS transistor circuitry is made smaller, it will increase the leakage current savings that are achievable when the enable signal is cleared, and accordingly the reference line 195 is not connected to the ground potential, but will have more of a reducing effect on read performance. Accordingly, it would be necessary to further boost the word line in order to overcome that reduction in performance.

Figure 3:
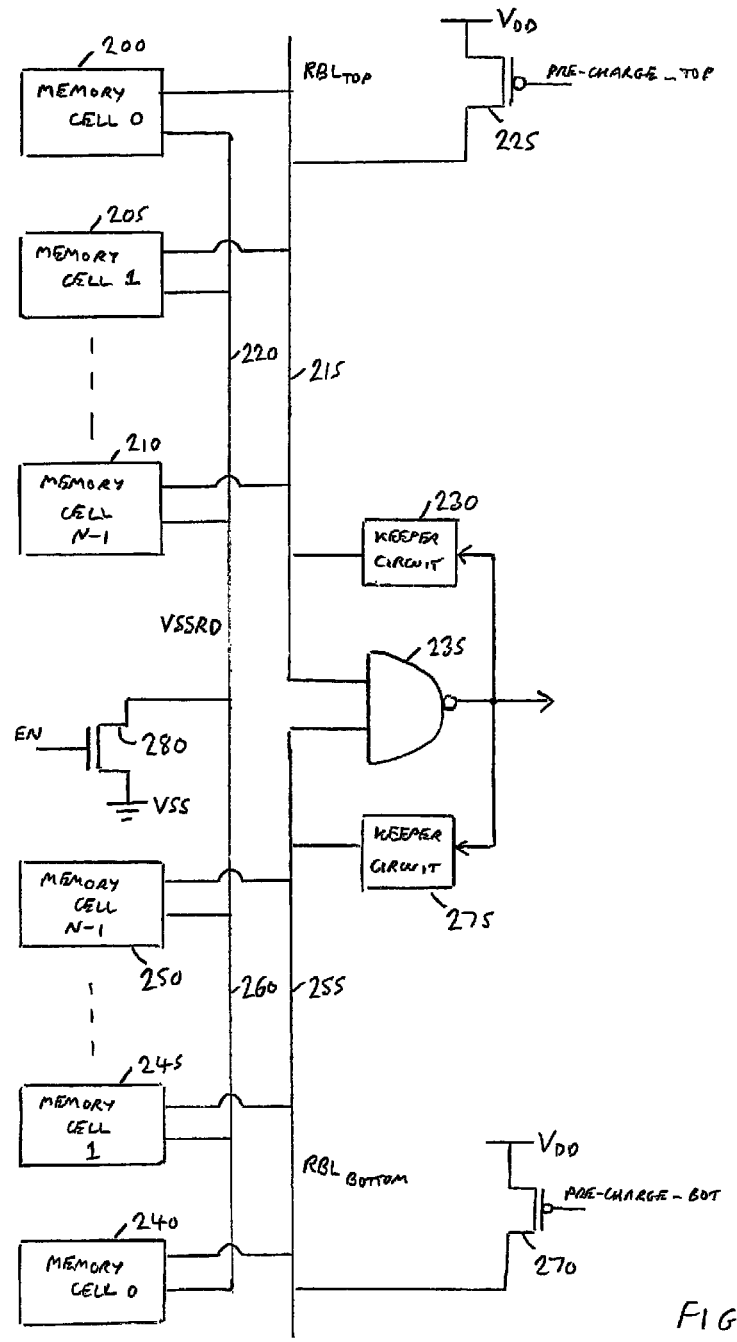
FIG. 3 illustrates the same column arrangement as in FIG. 2, but with the reference line shared between the top and bottom sections, in accordance with an alternative embodiment.

Whilst in the embodiment of FIG. 2 a separate reference line 195 and associated reference line control circuitry 190 is provided for both the top and bottom sections of the column coupled to the NAND structure 180, in accordance with an alternative embodiment shown in FIG. 3 a single reference line and associated reference line control circuitry can be used. Accordingly, the top section includes a plurality of memory cells 200, 205, 210 coupled to an associated read bit line 215, whilst the bottom section also consists of a plurality of memory cells 240, 245, 250 connected to an associated read bit line 255. Both local bit lines 215, 255 provide an input to the NAND gate 235, and both sections have their own associated keeper circuits 230, 275. Similarly, both sections have their own separate precharging circuits 225, 270 to allow the top and bottom read bit lines to be precharged independently of each other.

However, in accordance with the embodiment of FIG. 3, a single reference line 220 is provided to which all of the coupling circuits 130 of the various memory cells 200, 205, 210, 240, 245, 250 are connected, and a single reference line control circuitry 280 is provided for selectively connecting that reference line to ground. In accordance with this embodiment, whenever either the top section or the bottom section is to be subjected to a read operation, then the reference line control circuitry 280 is activated to connect the reference line 220 to ground. However, in periods of time where neither the top section nor the bottom section is to be subjected to a read operation, the reference line control circuitry 280 can be deactivated, in order to cause the voltage on the reference line 220 to float, thereby significantly reducing leakage current.

Figure 4A:
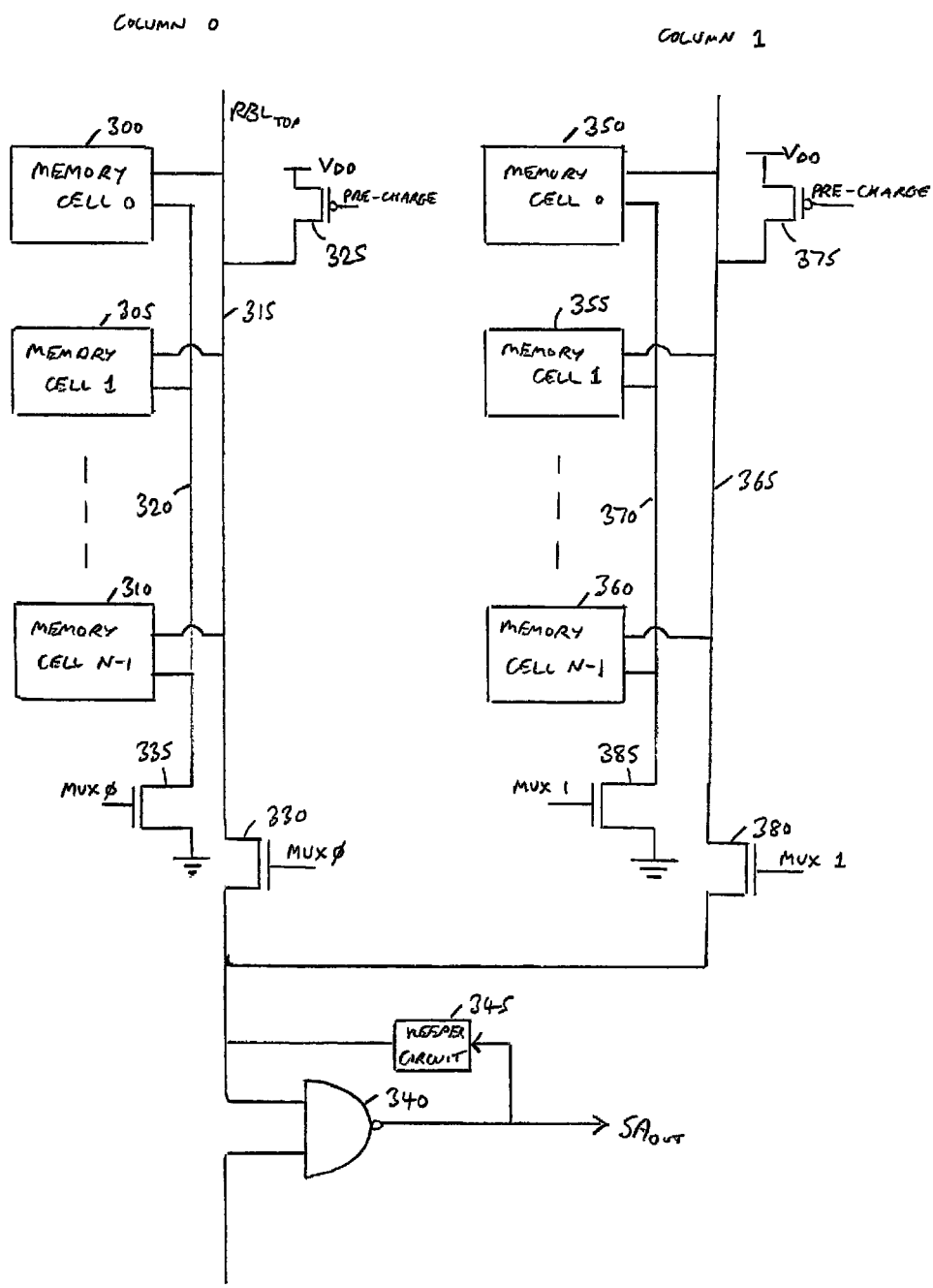
FIGS. 4A and 4B illustrate two possible arrangements for the reference lines in embodiments where two columns are configured in a multiplexed arrangement.

FIG. 4A illustrates an alternative embodiment where the array of memory cells is arranged in a multiplexed arrangement, in the particular example of FIG. 4A the array being configured in a MUX-2 arrangement. In accordance with this arrangement, a pair of columns share the sense amp circuitry 340 and the associated keeper circuit 345, with the transistors 330, 380 being used to selectively connect either the local read bit line 315 of the first column or the local read bit line 365 of the second column to the sense amplifier. Accordingly, in this embodiment only one of these two columns will be the subject of a read operation at any particular point in time.

Both columns are constructed in the same way, and accordingly the first column has a series of memory cells 300, 305, 310 coupled to an associated local read bit line 315, the local read bit line having associated precharge circuitry 325. Similarly, the second column has a series of memory cells 350, 355, 360 connected to an associated local read bit line 365, again that bit line having its own precharge circuitry 375.

Further, the first column has its own reference line 320 and associated reference line control circuitry 335, whilst the second column has its own reference line 370 and associated reference line control circuitry 385.

This configuration is also replicated for the bottom section of the column block.

When it is desired to perform a read operation on one of these columns, the relevant MUX signal will be asserted to either enable the transistor 330 or the transistor 380, and the same signal can also be used to drive the relevant reference line control circuitry 335, 385, so that when one of the local read bit lines is connected to the sense amplifier 340, the associated reference line is also connected to the ground potential.

Figure 4B:
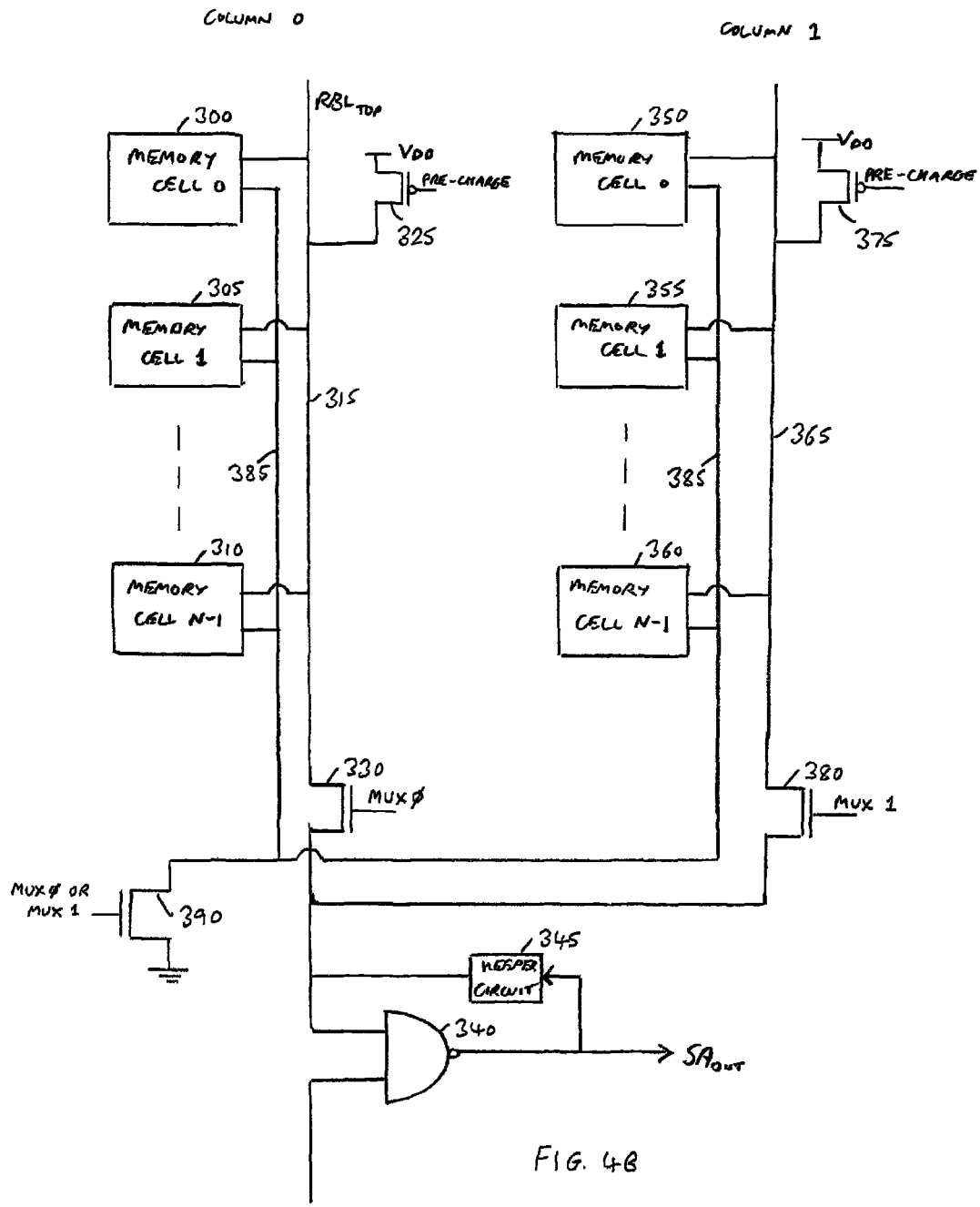

FIG. 4B illustrates an alternative arrangement which is identical to the arrangement of FIG. 4A, other than in its provision of a reference line. In particular, in this embodiment, a single reference line 385 is provided, with its own associated reference line control circuitry 390. In this embodiment, the enable signal for the reference line control circuitry 390 is obtained by performing a logical OR operation on the MUX 0 and MUX 1 signals.

It will be appreciated that further configurations are possible, for example the approach of FIG. 4B could be extended by also combining it with the approach of FIG. 3, so that the single reference line is also shared between the top and bottom sections.

Whilst not explicitly shown in FIGS. 3, 4A and 4B, all of these configurations will also use the word line booster circuitry 197 to boost the asserted read word line during the performance of a read operation, hence ensuring that the read performance is not affected by the provision of the reference line control circuitry.

Figure 5A:
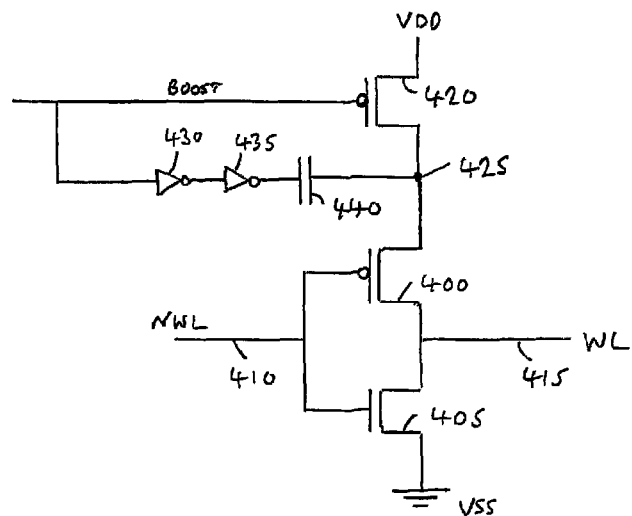
FIG. 5A illustrates word line boosting circuitry in accordance with one embodiment.

The word line booster circuitry 197 can take a variety of forms. A particular example configuration is shown in FIG. 5A. In particular, the PMOS transistor 400 and NMOS transistor 405 form an inverter as a final stage of word line driver circuitry used to generate the word line signal on path 415 on the basis of an input signal to the inverter on path 410.

In this configuration, the word line booster circuitry takes the form of a PMOS transistor 420 coupling the inverter with the power supply voltage, along with a delay element formed by the inverters 430, 435 and a capacitor element 440. As will be discussed in more detail with reference to FIG. 5B, the word line booster circuitry 197 serves to boost the voltage at the node 425 during at least part of the period in which an asserted word line signal is output over path 415, hence boosting the voltage of that asserted word line signal.

Figure 5B:
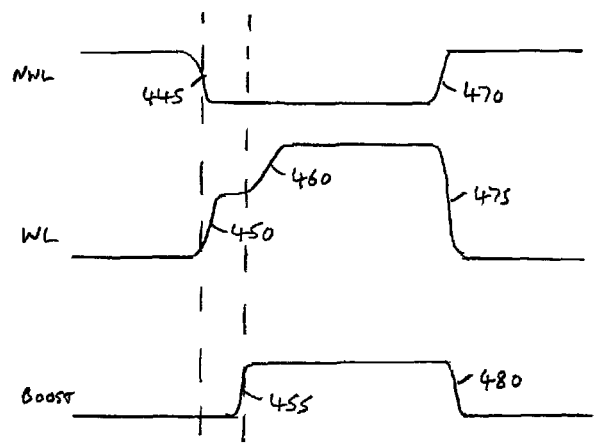
FIG. 5B is a timing diagram illustrating the operation of the circuitry of FIG. 5A.

In particular, as shown in FIG. 5B, when the input signal NWL on path 410 transitions to a logic zero level at the point 445, this will cause the inverter 400, 405 to transition the output on the path 415 forming the word line (WL) signal to a logic one level. This is indicated by the transition 450 in FIG. 5B.

During this period of time, the boost signal provided as an input to the PMOS transistor 420 is retained at a logic zero level, hence turning on the PMOS transistor 420, and ensuring that the node 425 is at the power supply voltage VDD. However, as indicated by the transition 455, this boost signal is subsequently transitioned to a logic one level. This transition is delayed in transit to the left side of the capacitor 440 via the delay elements 430, 435 (although two inverters are shown in the example of FIG. 5A, it will be appreciated that the delay element can be formed from any number of inverters dependent on the amount of delay desired). However, as the voltage at the left hand side of the capacitor increases from the logic zero to the logic one level, it will also then, via the capacitive effect, increase the potential on the node 425. As shown by the transition 460, this causes the asserted word line signal on path 415 to have its voltage boosted to a higher level. This turns the transistor 140 within the coupling circuitry 130 on very strongly, improving the performance of the coupling circuitry.

Figure 6:
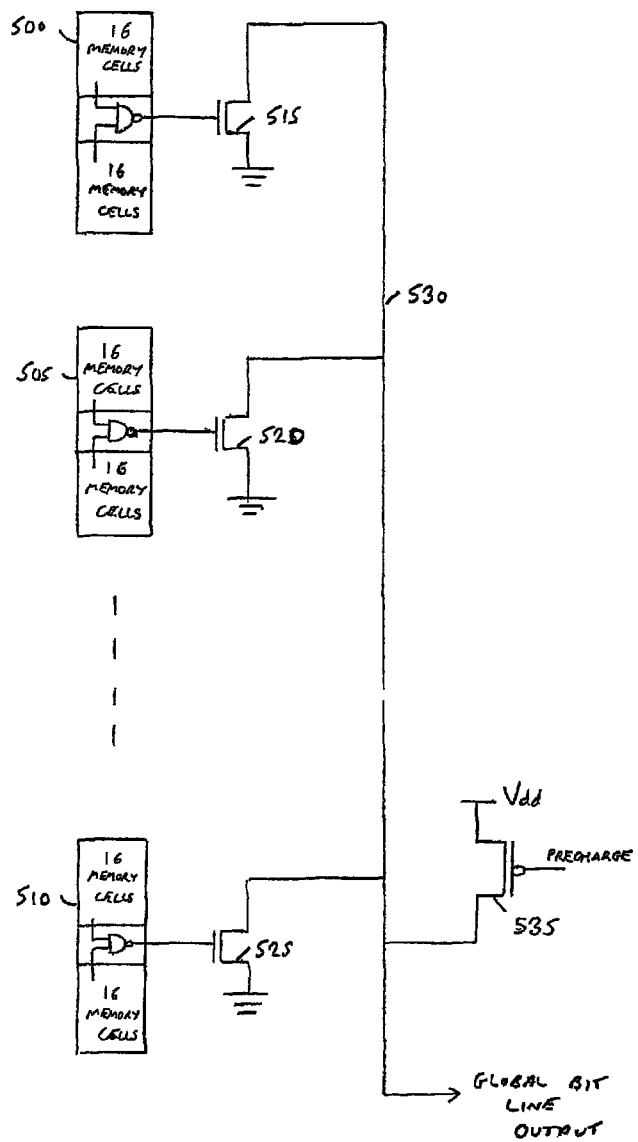
FIG. 6 illustrates how a plurality of block structures in accordance with FIG. 1A may be coupled to form a column of the memory array with an associated global read bit line.

FIG. 6 shows an arrangement where multiple of the block structures of FIG. 1A are arranged to form a column of the memory array. FIG. 6 shows one such column, where the top memory cell region and bottom memory cell region of each block contains 16 memory cells within their column group. The output from each sense amp is provided as an input to a corresponding NMOS transistor 515, 520, 525, and accordingly it will be seen that if any of the blocks 500, 505, 510 include an addressed memory cell that stores a logic one value at its node X 125, then the sense amp output will transition to a logic one level during the read operation and hence turn on the corresponding NMOS transistor. However, only one of those transistors will be turned on, since for any particular read operation, there will only be one addressed memory cell within a particular column. Hence, the global bit line 530, which is precharged by the precharge circuitry 535 to a logic one level prior to the start of the read operation, will be discharged towards a logic zero level if the addressed memory cell stores a logic one value at its node X 125. Otherwise, the global bit line output will remain at a logic one level. The voltage on the global bit line 530 can then be sensed by an appropriate global sense amplifier structure (not shown), for example an inverter.

Figure 7:
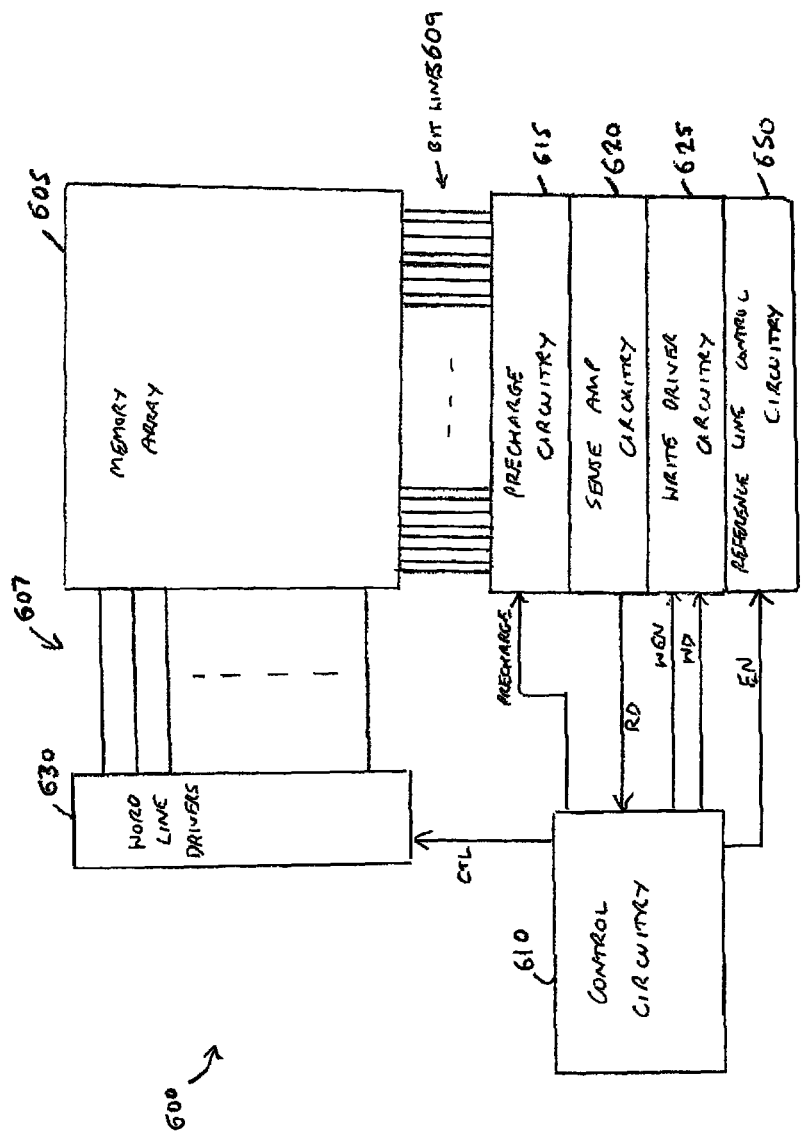
FIG. 7 is a block diagram schematically illustrating the logical arrangement of a memory device in accordance with one embodiment.

FIG. 7 is a diagram schematically illustrating a logical arrangement of a memory device in accordance with one embodiment. In particular, the memory device 600 includes a memory array 605 comprising an array of memory cells arranged in a plurality of rows and columns. A plurality of word lines 607 (including the earlier-described write word lines and read word lines) are provided through the array in order to allow individual rows of memory cells to be addressed by the word line drivers 630 during write and read operations. In addition, a plurality of bit lines 609 (including the write bit line pairs, and the read bit lines referred to earlier) are provided in association with the columns of memory cells. Each column is coupled to the relevant write and read bit lines to enable data to be written into an activated memory cell of the column during a write operation, and for data to be read from an activated memory cell of the column during a read operation.

Precharge circuitry 615 is used to precharge the voltage level on the bit lines under the control of control circuitry 610. Following the precharge operation, a write operation or read operation can be performed. For a write operation, the control circuitry 610 will issue a control signal to the word line drivers 630 in order to cause a particular row of memory cells to be activated via the associated write word line, and the control circuitry 610 will further cause the write driver circuitry 625 to control the voltages on the relevant write bit line pairs, in order to cause the required data values to be written into the memory cells of the activated row. For a read operation, again the control circuitry 610 will issue a control signal to the word line drivers 630 in order to cause a particular row of memory cells to be activated via the appropriate read word line, and the sense amplifier circuitry 620 will then be used in order to evaluate the voltages on the relevant read bit lines, with the sensed read data then being returned to the control circuitry 610.

The word line driver circuitry 630 will include the word line booster circuitry 197 discussed earlier. Further, a plurality of reference lines will be provided in association with the various local bit lines, with the reference line control circuitry including separate reference line control units for each of those reference lines, with the control circuitry 610 generating enable signals for those reference line control units.

Whilst FIG. 7 is intended to logically illustrate the arrangement of the memory device, it will be appreciated that it is not intended to provide an indication of the structural arrangement. For example, as will be apparent from the earlier discussion, the sense amplifier circuitry 620 is actually embedded within blocks forming the memory array, as is the precharge circuitry 615 and reference line control circuitry 650.

Figure 8:
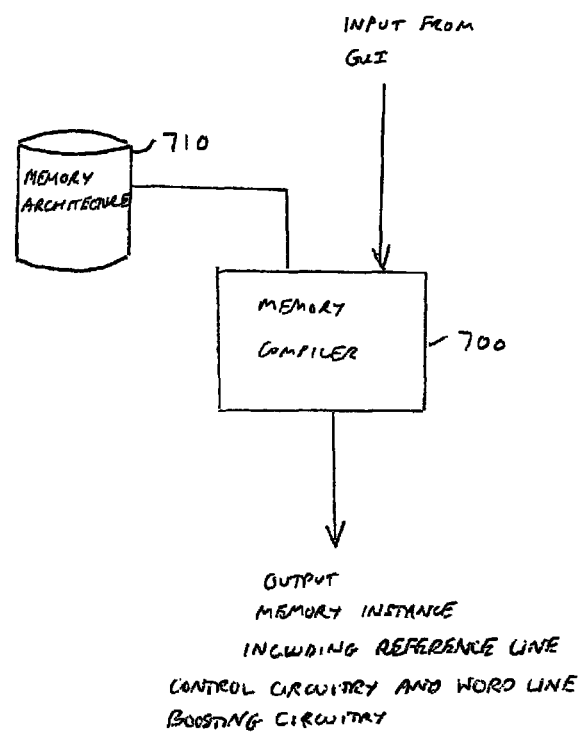
FIG. 8 is a diagram schematically illustrating the operation of a memory compiler to generate a memory instance including the reference line control circuitry and word line boosting circuitry of the described embodiments.

FIG. 8 schematically illustrates how a memory instance including reference line control circuits and word line boosting circuits in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 700 then generates the required memory instance based on the input parameters and the memory architecture 710. In accordance with one embodiment, the memory compiler includes a plurality of reference lines, each with an associated reference line control unit, and also provides read word line booster circuitry in association with each read word line driver, for use in the manner described with reference to the earlier figures.

Figure 9:
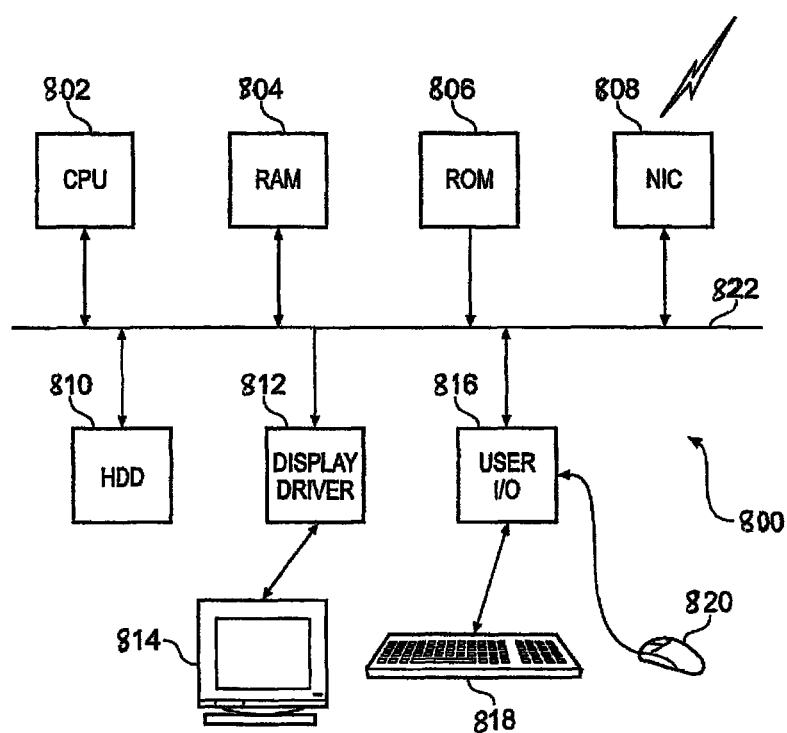
FIG. 9 is a diagram of a computer system on which a memory compiler operation may be performed to generate a memory instance conforming to the above described embodiments.

FIG. 9 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could vary considerably and FIG. 9 is only one example.

From the above described embodiments, it will be appreciated that the techniques of the described embodiments provide an improved mechanism for reducing leakage current within a memory device, without compromising the read performance of the memory device.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A memory device comprising:

an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation is able to be performed on an activated memory cell within that column group, and a non-active mode of operation where said read operation is not able to be performed;

precharge circuitry configured, for each column group, to precharge a voltage on the associated read bit line to a first voltage level prior to said read operation;

each memory cell comprising coupling circuitry connected between the associated read bit line and a reference line associated with the column group containing that memory cell;

reference line control circuitry configured, for each reference line having an associated column group in said active mode of operation, to connect that reference line to a second voltage level different to said first voltage level, and configured for each reference line not having an associated column group in said active mode of operation to disconnect that reference line from said second voltage level; and word line boosting circuitry configured to generate an asserted word line signal at a boosted voltage level on the read word line associated with the row of memory cells to be activated during said read operation;

during said read operation the coupling circuitry associated with each activated memory cell is configured to be activated by the asserted word line signal and to selectively discharge the associated read bit line towards the second voltage level present on said associated reference line dependent on a data value stored within that activated memory cell; and for each reference line not having an associated column group in said active mode of operation, the action of the reference line control circuitry disconnecting that reference line from the second voltage level serving to remove a leakage current path through the coupling circuitry of each memory cell of that associated column group.

2. The memory device as claimed in claim 1, wherein each column group is configured to have its own reference line.

3. The memory device as claimed in claim 1, wherein multiple of said column groups share the reference line.

4. The memory device as claimed in claim 3, wherein said multiple of said column groups reside within a single column of the memory array.

5. The memory device as claimed in claim 3, wherein said multiple of said column groups reside within multiple columns of said array that are provided in a multiplexed arrangement such that only one of those multiple columns is activated during the read operation.

6. The memory device as claimed in claim 1, wherein:
the reference line control circuitry comprises a reference line control unit for each reference line, and the memory device comprises control circuitry configured to generate an enable signal for each reference line control unit; and
each reference line control unit is responsive to the control circuitry setting the enable signal to connect said associated reference line to said second voltage level, and is responsive to the control circuitry clearing the enable signal to disconnect said associated reference line from said second voltage level.

7. The memory device as claimed in claim 6, wherein each reference line control unit comprises NMOS transistor circuitry, and the enable signal is set to a logic one value.

8. The memory device as claimed in claim 6, wherein the enable signal is derived from a column multiplexer read selection signal used to identify the columns of the array whose memory cells are to be subjected to the read operation.

9. The memory device as claimed in claim 1, further comprising:
word line driver circuitry configured, during the read operation, to generate the asserted word line signal as a pulse signal on the read word line coupled to the row of memory cells to be activated during said read operation so as to activate those memory cells whilst the pulse signal is asserted, the word line boosting circuitry being incorporated within the word line driver circuitry; and
sense amplifier circuitry connected to the associated read bit line of each column group, and configured for each activated memory cell to determine that that activated memory cell stores a first value if the voltage on the associated read bit line transitions to a trip voltage level between said first and said second voltage levels whilst the pulse signal is asserted, and to determine that the activated memory cell stores a second value if the voltage on the associated read bit line does not transition to said trip voltage level whilst the pulse signal is asserted.

10. The memory device as claimed in claim 9, wherein said word line driver circuitry includes an inverter circuit whose output forms the pulse signal, and the word line boosting circuitry is configured to boost the voltage across the inverter circuit for at least part of the period that the pulse signal is asserted.

11. The memory device as claimed in claim 9, further comprising:
bit line keeper circuitry coupled to each read bit line and configured during a read operation to weakly pull the voltage on each read bit line towards the first voltage level so as to avoid leakage current within the coupling circuitry of the memory cells of the associated memory cell group from causing the voltage on the associated read bit line to transition to said trip voltage level between said first and said second voltage levels whilst the pulse signal is asserted.

12. The memory device as claimed in claim 1, wherein the coupling circuitry of each memory cell comprises a plurality of coupling transistors arranged in series between the associated read bit line and said reference line, a gate terminal of at least one of the coupling transistors being connected to the associated read word line and a gate terminal of at least one other of the coupling transistors being connected to an internal storage node of the memory cell.

13. The memory device as claimed in claim 1, wherein the first voltage level is a supply voltage level and the second voltage level is a ground voltage level.

14. The memory device as claimed in claim 1, wherein each column of memory cells forms a plurality of column groups.

15. A method of controlling leakage current within a memory device comprising an array of memory cells arranged as a plurality of rows and columns, each row of memory cells being coupled to an associated read word line, each column of memory cells forming at least one column group, and the memory cells of each column group being coupled to an associated read bit line, each column group having an active mode of operation where a read operation is able to be performed on an activated memory cell within that column group, and a non-active mode of operation where said read operation is not able to be performed, the method comprising:
for each column group, precharging the associated read bit line to a first voltage level prior to said read operation;

for each memory cell, providing coupling circuitry connected between the associated read bit line and a reference line associated with the column group containing that memory cell;

for each reference line having an associated column group in said active mode of operation, connecting that reference line to a second voltage level different to said first voltage level;

generating an asserted word line signal at a boosted voltage level on the read word line associated with the row of memory cells to be activated during said read operation;

during said read operation, causing the coupling circuitry associated with each activated memory cell to be activated by the asserted word line signal and to selectively discharge the associated read bit line towards the second voltage level present on said associated reference line dependent on a data value stored within that activated memory cell; and for each reference line not having an associated column group in said active mode of operation, disconnecting that reference line from said second voltage level in order to remove a leakage current path through the coupling circuitry of each memory cell of that associated column group.

16. A memory device comprising:

an array of memory cell means arranged as a plurality of rows and columns, each row of memory cell means for coupling to an associated read word line, each column of memory cell means for forming at least one column group, and the memory cell means of each column group for coupling to an associated read bit line, each column group having an active mode of operation where a read operation is able to be performed on an activated memory cell means within that column group, and a non-active mode of operation where said read operation is not able to be performed;

precharge means, for each column group, for precharging the associated read bit line to a first voltage level prior to said read operation;

each memory cell means comprising coupling means for connecting between the associated read bit line and a reference line associated with the column group containing that memory cell means;

reference means, for each reference line having an associated column group in said active mode of operation, for connecting that reference line to a second voltage level different to said first voltage level, and for each reference line not having an associated column group in said active mode of operation, for disconnecting that reference line from said second voltage level; and means for generating an asserted word line signal at a boosted voltage level on the read word line associated with the row of memory cell means to be activated during said read operation;

during said read operation, the coupling means associated with each activated memory cell means being activated by the asserted word line signal and for selectively discharging the associated read bit line towards the second voltage level present on said associated reference line dependent on a data value stored within that activated memory cell means; and for each reference line not having an associated column group in said active mode of operation, the action of the reference means disconnecting that reference line from the second voltage level serving to remove a leakage current path through the coupling means of each memory cell of that associated column group.

17. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies the memory device as claimed in claim 1.

\* \* \* \* \*